(12) United States Patent
Woodley

(10) Patent No.: US 6,665,322 B2
(45) Date of Patent: Dec. 16, 2003

(54) METHOD AND APPARATUS FOR CONTROLLING THE LENGTH OF AN OPTICAL CAVITY

(75) Inventor: Bruce Robert Woodley, Mountain View, CA (US)

(73) Assignee: San Jose Systems Inc., Sunnyvale, CA (US)

( * ) Notice: Subject to any disclaimer, the term of this patent is extended or adjusted under 35 U.S.C. 154(b) by 57 days.

(21) Appl. No.: 10/099,976

(22) Filed: Mar. 19, 2002

(65) Prior Publication Data

US 2003/0179787 A1 Sep. 25, 2003

(51) Int. Cl.[7] .................................................. H01S 3/13
(52) U.S. Cl. .................... 372/29.02; 372/64; 372/87; 372/29.015; 372/38.07; 372/106
(58) Field of Search ..................... 372/29.015, 64, 372/87, 106, 38.07, 29.02

(56) References Cited

U.S. PATENT DOCUMENTS 4,803,692 A * 2/1989 Sakano et al. ............... 372/50
5,543,945 A * 8/1996 Kimura et al. ............... 349/19
5,581,572 A * 12/1996 Delorme et al. .............. 372/50
2002/0118711 A1 * 8/2002 Jacquet ....................... 372/20

* cited by examiner

Primary Examiner—Leon Scott, Jr.
(74) Attorney, Agent, or Firm—Katten Muchin Zavis Rosenman

(57) ABSTRACT

Apparatus and method for controlling the length of a laser cavity comprises a laser diode that is configured to produce a beam of energy, the laser diode has a first end and an output end, the first end being in optical communication with a highly reflective mirror. A wave guide having a receiving end and a transmission end is also provided, with the wave guide being comprised of an electro-optical material, wherein the receiving end is in optical communication with the output end, and the transmission end is in optical communication with an output coupler. A plurality of electrodes are disposed along a longitudinal axis of the wave guide, wherein the voltage on each electrode is independently controlled to alter the index of refraction of the wave guide at a position adjacent each electrode. A polarizer is also provided with respect to the transmission end, with the polarizer configured to attenuate the beam of energy.

111 Claims, 4 Drawing Sheets

METHOD AND APPARATUS FOR CONTROLLING THE LENGTH OF AN OPTICAL CAVITY

RELATED APPLICATIONS

This application is related to U.S. patent application Ser. No. 09/954,495, filed Sep. 10th, 2001, and entitled "Wavelength Agile Laser", which is incorporated herein by reference.

BACKGROUND OF THE INVENTION

1. Field of the Invention

The invention pertains to the field of optical networks employing dense wavelength division multiplexing (hereafter DWDM) and in particular to a method and apparatus for controlling the length of a laser cavity.

2. Description of the Related Art

The evolution of telecommunications networks has been such that the amount of data that can be carried by a single fiber have in general, greatly increased. Key to transporting large volumes of information over a single fiber is DWDM technology. DWDM enables the transmission of multiple "colors" or wavelengths of light over a single fiber, thereby greatly enhancing data throughput. The source for each wavelength of light is a single frequency laser, which is tuned to a precise wavelength during manufacture and/or during operation. Transmission lasers may be designed to operate a single wavelength for the duration of their useful life, or may be designed to be "tunable", that is, their wavelength of operation may be changed from time to time.

DWDM systems typically comprise multiple separately modulated laser systems at the transmitter. These laser systems are designed or actively tuned to operate at different wavelengths.

When their emissions are combined in an optical fiber, the resulting WDM optical signal has a corresponding number of spectrally separated channels. Along the transmission link, the channels are typically collectively amplified in semiconductor amplifier systems or gain fiber, such as erbium-doped fiber and/or regular fiber, although semiconductor optical amplifiers are also used in some situations.

At the receiving end, the channels are usually separated from each other using, for example, thin film filter systems to thereby enable detection by separate detectors, such as photodiodes.

The advantage of DWDM systems is that the transmission capacity of a single fiber can be increased. Historically, only a single channel was transmitted in each optical fiber. In contrast, modern WDM systems contemplate hundreds of spectrally separated channels per fiber. This yields concomitant increases in the data rate capabilities of each fiber. Moreover, the cost per bit of data in WDM systems is typically less than comparative non-multiplexed systems. This is because optical amplification systems required along the link is shared by all of the separate wavelength channels transmitted in the fiber. With non-multiplexed systems, each channel/fiber would require its own amplification system.

However, there are challenges associated with implementing WDM systems. First, the transmitters and receivers are substantially more complex since, in addition to the laser diodes and receivers, optical components are required to combine the channels into, and separate the channels from, the WDM optical signal. Moreover, there is the danger of channel drift where the channels lose their spectral separation and overlap each other. This interferes with channel separation and demodulation at the receiving end.

The optical signal generators, e.g., the semiconductor laser systems that generate each of the optical signals corresponding to the optical channels for a fiber link, must have some provision for wavelength control. Especially in systems with center-to-center wavelength channel spacings of less than 1 nanometer (nm), the optical signal generator must have a precisely controlled carrier wavelength. Any wander impairs the demodulation of the wandering signal at the far end receiver since the wavelength is now at a wavelength different than expected by the corresponding optical signal detector, and the wandering signal can impair the demodulation of spectrally adjacent channels when their spectrums overlap each other.

In addition to wavelength stability, optical signal generators that are tunable are also desirable for a number of reasons. First, from the standpoint of manufacturing, a single system can function as the generator for any of the multiple channel wavelength slots, rather than requiring different, channel slot-specific systems to be designed, manufactured, and inventoried for each of the hundreds of wavelength slots in a given WDM system. From the standpoint of the operator, it would be desirable to have the ability to receive some wavelength assignment, then have a generator produce the optical signal carrier signal into that channel assignment on-the-fly.

For telecommunications applications involving DWDM, the wavelength range used is in what is known as the third window. The third window is the spectral region within which the attenuation exhibited by the transmission medium (commonly silica glass) is the lowest. Although loosely defined, the third window may be identified to lie in the spectral region from 1500 nm to 1650 nm. Within this window the designations "S", "C" and "L" represent subdivisions of this spectral region. An object of transmission laser performance is therefore the capability to address the spectral region associated with S, C and L-band wavelengths. A further object of a transmission laser is that it is compliant with what is known as the "ITU grid". The ITU grid is a defined standard covering the placement, in frequency space, of optical channels launched onto a fiber. Transmission lasers must exhibit optical specifications compatible with high performance optical transmission.

For a detailed description of the structure an optical performance requirements set on transmission lasers resort may be had to J. Gowar, "Optical Communications Systems", Second Edition, Prentice Hall International Series in Optoelectronics, pages 257 to 487, inclusive, the contents of which are incorporated herein by reference.

It is desirable that transmission lasers (tunable or fixed) operate with a single longitudinal mode (Fabry-Perot mode) in the laser cavity, and that the primary longitudinal mode that is lasing does not change over the duration of operation of the laser. "Mode hopping", that is, the changing of the longitudinal mode of operation, may be prevented by carefully controlling the optical length of the laser cavity.

The optical length of the laser cavity is generally a function of the effective index of refraction in the materials in the cavity, and the mechanical length of the cavity. Both of these properties are strong functions of temperature, thus temperature changes are a major source of disturbance that can cause mode hopping. Other physical phenomena that can lead to mode hopping include mechanical stress (causing length changes), vibration, changes in the material index due to aging and the like.

Another desirable feature of transmission lasers is the absolute frequency at which they operate. In order to control the absolute frequency, the optical length of the laser cavity should be controlled such that the desired absolute frequency is coincident with one of the cavity's longitudinal modes.

One method of controlling cavity length, and thereby preventing mode hopping and controlling the absolute frequency of the Fabry-Perot modes, is through active temperature control of the materials in the laser cavity. One method of controlling the temperature of DWDM semiconductor diode lasers is via a temperature sensing thermistor, a proportional integral derivative (PID) feedback control law, and a thermo-electric cooler (TEC) temperature actuator, although different choices for sensors, control laws, and actuators are clearly possible. Temperature control may be used to maintain a constant effective optical cavity length, for example laser devices using a rare earth ion (such as neodymium) doped into a crystalline host material as the active medium.

Another approach is to use a cavity that is constructed of a combination of materials, some in which the optical length increases with increasing temperature, and others in which the optical length decreases with increasing temperature. The goal is to create a cavity that has an optical length that is constant over the normal temperature range of operation, thus mode hopping does not occur, provided significant temperature gradients do not exist across the laser cavity. U.S. Pat. No. 6,324,204 to Deacon, incorporated herein by reference, describes such a device.

Yet another approach for temperature compensation of optical devices employs passive mechanical temperature compensation. The device is mechanically strained, and then attached to a material that has either a negative coefficient of thermal expansion, or is attached to a bimetallic material. In either case, as the temperature increases, the strain on the optical material is relieved, thereby compensating for the intrinsic optical length increase of the optical material.

The above techniques rely on either active means of controlling the temperature of the materials inside the laser cavity, or on passive mechanical means of compensating for changes in the optical length of the cavity. Both of these techniques require the addition of components above and beyond what is strictly necessary to produce a laser device.

There is therefore the need for a device that maintains a constant cavity length through active controls directly associated with the transmitter which prevents mode hopping and controls the absolute frequency of the Fabry-Perot modes of the transmitter. Such a device has the potential to significantly reduce the manufacturing cost via parts count reduction.

SUMMARY OF THE INVENTION

The present invention is capable of producing stable, uncooled, single mode lasers for use in optical communications. The lasers of the present invention may operate at a fixed wavelength throughout its operational life, or may be tuned from time to time in order to operate at other wavelengths.

According to one general aspect of the present invention, an apparatus for controlling the length of a laser cavity comprises a laser diode that is configured to produce a beam of energy, the laser diode has a first end and an output end, the first end being in optical communication with a highly reflective mirror. A wave guide having a receiving end and a transmission end is also provided, with the wave guide being comprised of an electro-optical material, wherein the receiving end is in optical communication with the output end, and the transmission end is in optical communication with an output coupler. A plurality of electrodes are disposed in close proximity along a longitudinal axis of said wave guide is further provided, wherein the voltage on each electrode is independently controlled to alter the index of refraction of the wave guide at a position adjacent each electrode. A polarizer is also provided with respect to the transmission end, with the polarizer configured to attenuate the beam of energy.

According to another general aspect of the present invention, a wave guide for controlling the output of an energy source comprises a body having electro-optical material having an input end, an output end, and a longitudinal axis. A plurality of electromagnetic fields coupled to the body is provided, wherein the index of refraction of the body is altered along said longitudinal axis in relation to each electromagnetic field. A polarizer disposed adjacent the output end is configured to filter unwanted portions of a signal associated with the energy source.

According to yet another general aspect present invention, a transmitter for use with a fiber optic telecommunications network comprises a semi-conductor optical gain means configured to receive an input signal, the optical gain means producing an output signal associated with the input signal. A wave guide means is provided that has an input means in optical communication with the optical gain means, the wave guide means comprising an electro-optical material. A plurality of electrode means in electromagnetic communication with the wave guide means is further provided, wherein each electrode means alters the index of refraction of the wave guide means adjacent each electrode means. A filter means disposed on the wave guide means to filter unwanted portions of a signal associated with the output signal is also provided.

According to still another general aspect of the present invention, an electro-magnetically tuned laser source with an athermal resonator comprises a laser gain medium and an intracavity waveguide segment comprised of electro-optical material optically coupled to the laser gain medium. A feedback means is provided for defining a resonant laser cavity including the gain medium and the intracavity waveguide segment, the feedback means including a plurality of electrode means disposed along the intracavity waveguide segment, each electrode being selectably energized for tuning a frequency of operation of the laser cavity.

According to still another general aspect of the present invention, a method for controlling the output frequency of a laser comprises the steps of providing a laser gain medium and placing an intracavity waveguide segment comprised of electro-optical material in optical communication with the laser gain medium. A feedback means is provided for defining a resonant laser cavity, the resonant laser cavity including the gain medium and the intracavity waveguide segment, the feedback means comprising a plurality of electrodes disposed along the intracavity waveguide segment. The electrodes are selectably energized to tune a frequency of operation of the laser.

According to yet another general aspect of the present invention, computer readable storage media stores code which causes a host processor to control a cavity length of a laser assembly in a telecommunication system. The laser assembly comprising a laser gain medium is optically coupled to a waveguide segment, the waveguide segment comprised of electro-optical material and a plurality of electrodes adjacent a surface of the waveguide segment. The code causes the host processor to receive a required operating frequency of the laser assembly. The code measures an actual operating frequency of the laser assembly and receives data from a sensor, the sensor being configured to measure a temperature of the laser assembly. The code selectably energizes each of the electrodes based on the data from the sensor, such that the cavity length of the waveguide segment is controlled.

According to another general aspect of the present invention, a method for controlling the optical length of a laser cavity is provided which comprises the steps of providing a laser gain medium and placing an intracavity waveguide segment comprised of electro-optical material in optical communication with the laser gain medium. A plurality of electrodes are disposed along a longitudinal axis of the intracavity wave guide segment and a predetermined first set of said electrodes is energized to control the optical length of the laser cavity.

Further objects and advantages of the present invention will appear hereinbelow.

DETAILED DESCRIPTION OF THE PRESENTLY PREFERRED EMBODIMENTS

The, preferred embodiment of the present invention will be described with respect to the structure and function disclosed in U.S. patent application Ser. No. 09/954,495, filed Sep. $10^{th}$, 2001, and entitled "Wavelength Agile Laser", by Woodley et al., the contents of which are incorporated herein by reference.

Figure 1:
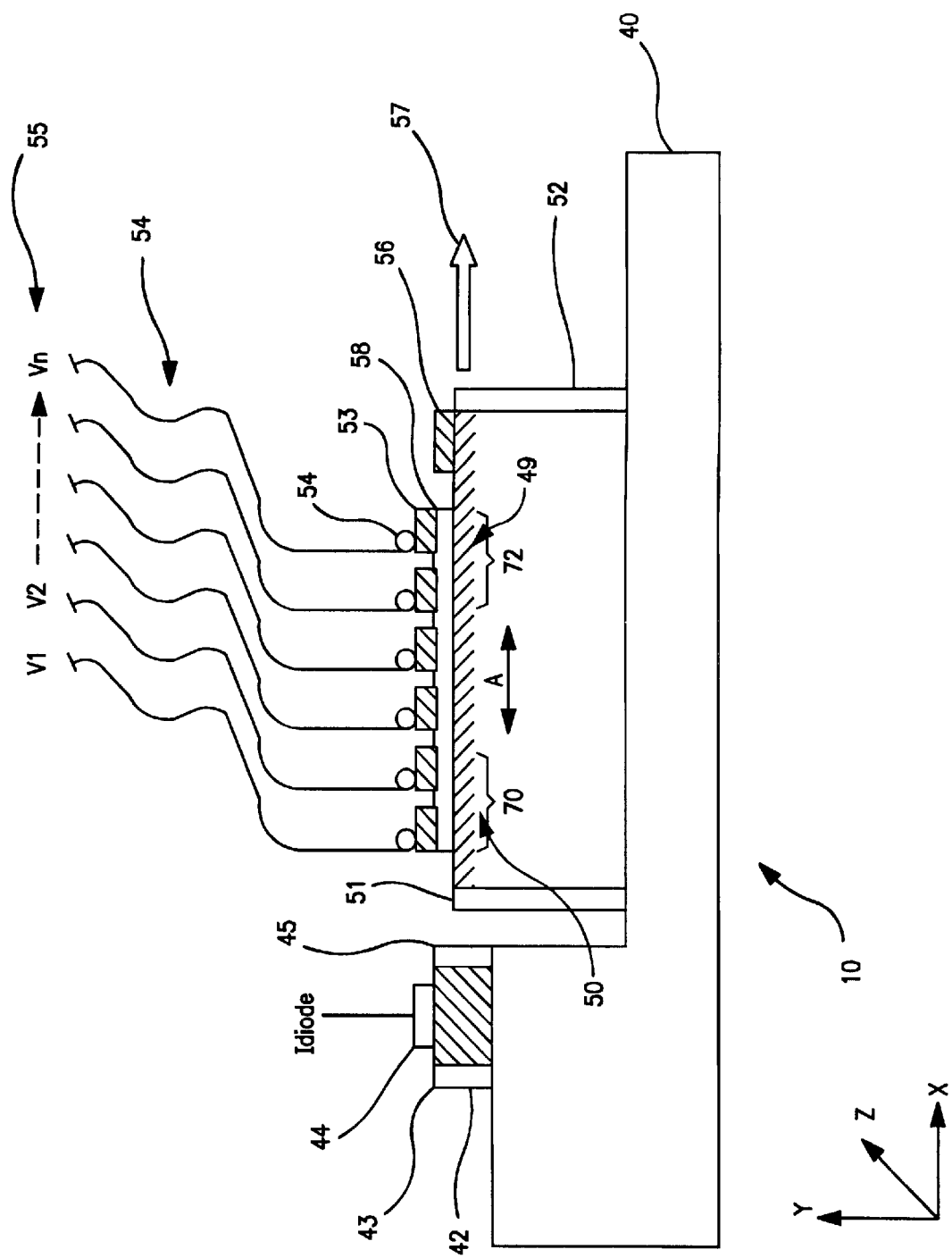
FIG. 1 is a simplified side view of a preferred embodiment of the present invention.

Referring to FIG. 1, the preferred embodiment of the transmitter 10 comprises an extended cavity laser formed from the coupling of a III–V semiconductor laser diode 42 to an electro-optic chip 50. The laser diode 42 is a semiconductor gain chip that acts as a source of optical gain, whereas the electro-optic chip 50 serves as a filter which defines single frequency operation. Preferably the laser diode 42 comprises an InP device with either a ridge waveguide, or a buried HET guiding structure. The laser diode preferably has a broad gain spectrum covering greater than 40 nm of bandwidth in either the C or L bands. The preferred dimensions are approximately 750 micros in length, and in the case of a ridge device, ridge widths of approximately 2 microns. Preferably the electo-optic chip 50 comprises x-cut lithium niobate 1 mm thick, 12 mm long, and 5 mm wide.

The laser diode 42 is preferably affixed to a submount 40. Preferably the submount 40 comprises aluminum nitride large enough to simplify material handling during assembly. The laser diode 42 has a cavity defining dielectric stack mirror 43 (reflectivity preferably >95%) placed on its outermost surface via ion-assisted electron beam evaporation, a contact pad 44 for the injection of current ($I_{diode}$) and an anti-reflecting dielectric stack surface 45 (reflectivity preferably <$10^{-4}$%) placed on the intra-cavity surface of the laser diode 42. The output beam from the laser diode 42 is transmitted to a waveguide 49 disposed on the electro-optic chip 50. Preferably, the waveguide 49 comprises a titanium indiffused waveguide made by electron beam sputtering a titanium strip 900 angstroms thick and 10.5 microns wide on top of the lithium niobate, then diffusing the titanium into the wafer for 8 hours at 1025 degrees Celsius in a 85% humidity, pure oxygen atmosphere.

The waveguide 49 has an anti-reflective dielectric stack surface 51 disposed on its intra-cavity face (reflectivity <$10^{-4}$%), as shown in FIG. 1, and the remaining cavity defining mirror 52 is disposed on the outermost face of the electro-optic chip 50. Overlaid upon the upper surface of the electro-optic chip 50 is a buffer layer 58 comprising an optically non-absorbing material such as silica ($SiO_2$), $Y_2O_3$, $Si_3N_4$, or the like. The buffer layer 58 preferably covers the entire length upon which a plurality of electrodes 53 are to be overlaid, and is approximately 2000 angstroms thick. The electrodes 53 are each electrically coupled to a voltage source 55, such as an array of voltage sources V1, V2, . . . Vn, by connection means 54. The voltage sources may each be a digital to analog converter (DAC), or may consist of analog sample and hold circuits that time share a single DAC, or may be a switch array that connects the electrodes to just one of many fixed voltage references.

To introduce polarization dependent loss, a polarization electrode 56 is deposited on top of the waveguide 49 without an intermediate buffer layer 58, or with a thinner buffer layer, for example, 200 angstroms of $SiO_2$. The polarization electrode 56 acts as a polarizer which preferentially passes TE polarized light. Laser output light exits the laser cavity through an output coupler 57. The polarization electrode 56 can be made of sputtered aluminum, chromium or other metal with similar permittivity properties at optical wavelengths. It is also possible that polarization dependent loss might be effected by a structure that preferentially passes TM polarized light, for example the structure described in "Integrated Optical Proton Exchange TM-Pass Polarizers in $LiNbO_3$: Modelling and Experimental Performance" IEEE Journal of Lightwave Technology, Vol. 13, No. 8, August 1995, incorporated herein by reference.

Each of the laser diode 42 and the electro-optic chip 50 may be constructed with an integrated single mode waveguide, which defines the spatial direction and mode of propagation of light in each substance. The laser cavity is defined by the cavity defining dielectric stack mirror 43 which is a high reflector (preferably >95% reflectivity) on the extreme end of the laser diode 42 waveguide, and the cavity defining dielectric stack mirror 52 which is a moderate reflector (preferably approximately 70% reflectivity) on the extreme end of the electro-optic material's waveguide. The intra cavity surfaces of the laser diode 42 and the electro-optic chip 50 are anti-reflective coated with dielectric stack coatings, for example alternating coatings of silica and hafnia, in order to eliminate or substantially reduce the possibility of multi-cavity laser operation.

In the preferred embodiment, the electro-optic chip 50 is x-cut, y-propagating lithium niobate ($LiNbO_3$). In this orientation, the waveguide in $LiNbO_3$ is birefringent, that is, the effective indices of the transverse magnetic (TM) mode and the transverse electric (TE) mode are significantly different, thus the propagation constants for these modes ($\beta_{TM}$, $\beta_{TE}$) are also significantly different.

In the preferred embodiment, the optical laser diode 42 is a diode which is designed such that the optical gain in the diode's waveguide is greater for the guide's TE mode than for the guide's TM mode. The orientation of the diode-$LiNbO_3$ interface is such that the light coupled from the diode to the $LiNbO_3$ excites the TM mode in the $LiNbO_3$.

Near the output coupler end of the LiNbO$_3$ chip 50, an integrated polarizer 56 attenuates much of the energy in the TM mode, thereby acting as a TE pass filter. Between the polarizer 56 and the semiconductor diode 42, a series of electrodes 53 are positioned in close proximity to the waveguide 49. The voltage on each electrode is independently controlled by the voltage source 55 and a processor (to be described below), allowing the synthesis of electric fields in the electro-optic waveguide 49. Since LiNbO$_3$ is an electro-optic material, the electric fields alter the index of refraction in the waveguide 49 in direct proportion to the strength of the electric field in the material.

In the case where all the electrodes are grounded, since the propagation constants of the TE and TM modes are substantially different, optical energy in the waveguide 49 does not easily couple between these two modes. Of the light coupled into the LiNbO$_3$ TM mode at the diode end of the waveguide, very little of the light will couple into the TE mode as it propagates along the waveguide. The TE pass polarizer 56 will absorb most of the energy, and very little will reach the output coupler 57.

Spatial variations in the index of refraction of a waveguide (such as variations caused by an electric field in an electro-optic material) can induce wavelength selective coupling of energy from one waveguide mode to another waveguide mode, where the modes have different propagation constants. The coupling of energy is governed by the equations $$\frac{d(TM)}{dz} = -i\kappa(z)(TE)e^{-i(\beta_{TM}-\beta_{TE})z} \quad (1)$$

$$\frac{d(TE)}{dz} = -i\kappa(z)(TM)e^{-i(\beta_{TM}-\beta_{TE})z} \quad (2)$$

$$\kappa(z) = \frac{\beta_{TM}}{4} \int_{-\infty}^{\infty} \frac{\varepsilon^2 r(x,z) E^{(0)}(x,z)}{\varepsilon(x)\varepsilon_0} H^{TE}(x) E^{TM}(x)\, dx \quad (3)$$

where
TM is the complex amplitude of the TM mode
TE is the complex amplitude of the TE mode
r(x,z) is the electro-optic tensor of the material
ε is the permittivity of the material
ε$_0$ is the permittivity of free space
H$^{TE}$ (x) is the magnetic field associated with the TE mode
E$^{TM}$ (X) is the electric field associated with the TM mode
See the text "Quantum Electronics", (third edition) by Amnon Yariv, John Wiley & Sons, Inc. 1989 (incorporated herein by reference) for a complete discussion of wavelength selective mode coupling.

The application of spatially varying electric fields can induce wavelength dependent mode conversion. If the electric fields are properly chosen, one wavelength of light will be more efficiently coupled from the TM to the TE mode, and will thus experience the lowest loss as it travels through the polarizer. Thus the polarization dependency in the diode, the wavelength selective polarization mode conversion in the LiNbO$_3$ waveguide near the electrodes, and the attenuation of the TM mode by polarizer act in concert to select a single Fabry-Perot longitudinal mode, thereby ensuring that the laser operates as a single frequency laser.

It is desirable to directly control the cavity length of the laser, and therefore the frequencies that correspond to the Fabry-Perot modes of the cavity. The control of the lasing wavelength, and the absence of mode hopping are desirable features of telecommunications transmission lasers. Thus, the present invention provides precise control of the effective optical length of the laser cavity.

Consider the effective optical length of the laser cavity of the preferred embodiment. Let n$_d$ be the effective index of the diode material, let n$_{TM}$ be the effective index of the TM mode in the LiNbO$_3$, and let n$_{TE}$ be the effective index of the TE mode in the LiNbO$_3$. Assuming the diode and the LiNbO$_3$ are butt coupled, then the total optical length in the cavity is (ignoring the small gap between the laser diode and the LiNbO$_3$)

$$OL = L_d n_d + L_{TM} n_{TM} + OL_{mc} + L_{TE} n_{TE} \quad (4)$$

where L$_d$ is the physical length of the laser diode, L$_{TM}$ is the physical length of the waveguide between the laser diode and the mode converter, OL$_{mc}$ is the optical length of the mode converter section, and L$_{TE}$ represent the physical length of the waveguide section between the mode converter and the output coupler (including the polarizer). Not included in OL is the contribution from the small gap between the diode and the waveguide at the butt couple interface, which is assumed to be small.

The number of electrodes 53 in the mode converter section may be greatly increased, for example, doubled, thereby doubling the physical length of the mode converter section. Of course, none of the additional electrodes may be necessary to effect complete mode conversion at the preferred optical wavelength. The additional electrodes make it possible to choose the position along the waveguide at which mode conversion is effected.

Let L$_{ex}$ represent the physical length of the additional electrodes in the mode converter section. Let L$_{exTM}$ represent the physical length of the unused electrodes on the diode end of the mode converter, thus (L$_{ex}$-L$_{exTM}$) is the physical length of the unused electrodes on the polarizer end of the mode converter. Thus, the optical length of the cavity becomes $$OL = L_d n_d + (L_{TM} + L_{exTM}) n_{TM} + OL_{mc} + (L_{TE} + L_{ex} - L_{exTM}) n_{TE} \quad (5)$$

or $$OL = L_d n_d + L_{TM} n_{TM} + OL_{mc} + (L_{TE} + L_{ex}) n_{TE} + L_{exTM}(n_{TM} - n_{TE}) \quad (6)$$

At constant temperature and wavelength, all the terms in the above equation are substantially constant with the exception of L$_{exTM}$ (n$_{TM}$-n$_{TE}$). Since L$_{exTM}$ can be chosen by selecting the electrodes that are to be activated (thus controlling the physical location of the mode converter), it is possible to directly control the optical length of the cavity. As discussed previously, both the physical length of the materials in the optical cavity and the index of refraction of the materials in the optical cavity are a function of temperature. Using a computer (to be described below) to schedule L$_{exTM}$ as a function of measured temperature and laser output, it is possible to compensate for the other terms in the above equation, thereby ensuring single mode operation. Thus, by electrically shifting the location of electro-optic index perturbations, it is possible to control the optical length of a laser cavity. This control may be used to compensate for temperature variations, thereby eliminating the need for thermal control to prevent mode hopping in lasers.

It is possible to choose L$_{exTM}$ directly from measured temperature, thereby enabling the cavity to have a nearly constant optical length. Since the lengths of the materials, the indices of the materials, and the birefringence of the LiNbO$_3$ are all temperature dependent, the design equations result in a system of coupled equations, which are easily solved.

For example, and not by limitation, the following nomenclature will be used for the design equations:

$L_d$=the physical length of the laser diode at 0 degrees Celsius.

$L_x=L_{TM}+L_{exTM}$=the physical length of the LiNbO$_3$ waveguide between the diode and the beginning of the active mode converter electrodes.

$L_y$=the physical length of the LiNbO$_3$ waveguide that is part of the section of active mode converter electrodes.

$L_z$=the physical length of the LiNbO$_3$ waveguide between the section of active mode converter electrodes and the output coupler, which includes the section of the waveguide that includes the polarizer.

L=the total physical length of the LiNbO$_3$ waveguide at 0 degrees Celsius.

$\lambda$=the free space wavelength of the light that is emitted from the laser.

$n_{TM}$=the effective index of the TM mode in the LiNbO$_3$ waveguide.

$n_{TE}$=the effective index of the TE mode in the LiNbO$_3$ waveguide.

$n_d$=the effective index of the guided mode in the laser diode.

k=the number of half cycles of light that are in the laser cavity (an integer).

$m_d$=the number of cycles of light in the diode waveguide.

$m_x$=the number of cycles of light in the waveguide segment $L_x$ (TM mode).

$m_y$=the number of cycles of light in the waveguide segment $L_y$ as measured with respect to the TE mode.

$m_z$=the number of cycles of light in the waveguide segment $L_z$ (TE mode)

$\alpha_a$=the coefficient of thermal expansion of the LiNbO$_3$ device in the direction of propagation (y).

$\alpha_d$=the coefficient of thermal expansion of the diode device.

$Dn_d$=the rate of change of the index of refraction of the diode with respect to temperature.

Assuming an operating wavelength, it is possible to calculate the bulk indices of refraction of LiNbO$_3$ ($n_e$ and $n_o$) from the temperature dependent Sellmeier equation (7), (8), and Table I:

$$n = \sqrt{A_1 + \frac{A_2 + B_1 F}{\lambda^2 - (A_3 + B_2 F)^2} + B_3 F - A_4 \lambda^2} \quad (7)$$

$$F = \frac{T - 24.5}{T + 570.5} \quad (8)$$

where T is in degrees Celsius, and is in nm.

TABLE I

| | $n_e$ | $n_o$ |
|---|---|---|
| $A_1$ | 4.582 | 4.9048 |
| $A_2$ | 9.921 × 10$^4$ | 1.1775 × 10$^5$ |
| $A_3$ | 2.109 × 10$^2$ | 2.1802 × 10$^2$ |
| $A_4$ | 2.194 × 10$^{-8}$ | 2.7153 × 10$^{-8}$ |
| $B_1$ | 5.2716 × 10$^{-2}$ | 2.2314 × 10$^{-2}$ |
| $B_2$ | −4.9143 × 10$^{-5}$ | −2.9671 × 10$^{-5}$ |
| $B_3$ | 2.2971 × 10$^{-7}$ | 2.1429 × 10$^{-8}$ |

The difference between the bulk indices ($n_e$, $n_o$) and the effective indices ($n_{TE}$, $n_{TM}$) are given by:

$$n_{TE}=c_1 n_e \quad (9)$$

$$n_{TM}=c_2 n_o \quad (10)$$

where $c_1$ and $c_2$ are constants >1, and are to first order invariant over the useful wavelengths and temperatures. For Ti indiffused LiNbO$_3$ waveguides, $c_1$ and $c_2$ are very close to 1. Thus given any temperature and wavelength, it is possible to approximate $n_{TE}$ and $n_{TM}$ by $n_e$ and $n_o$ respectively.

One additional constraint that is enforced in this example design is that the difference between the number of wavelengths of light in the mode converter is assumed to be constant, that is $$L_y = \frac{m\lambda}{n_{TM} - n_{TE}} \quad (11)$$

where m is a positive integer. In the case where an oversampled sinusoidal electric field pattern is used in the mode converter section, the integer m also corresponds to the number of cycles of the sinusoidal electric field in the mode converter section. Strictly speaking, it is not necessary to maintain a constant m nor an integer m, however doing so simplifies the design equations.

The relationships between the number of wavelengths in each section and the lengths and indices are $$m_d=L_d(1+\alpha_d T)n_d(1+Dn_d T)/\lambda \quad (12)$$

$$m_x=L_x n_{TM}/\lambda \quad (13)$$

$$m_y = L_y n_{TE}/\lambda = \frac{m}{n_{TM}-n_{TE}} n_{TE} \quad (14)$$

$$m_z=L_z n_{TE}/\lambda \quad (15)$$

Also, the length of the three sections of the LiNbO$_3$ must add up to the total length of the cavity $$L_x+L_y+L_z=L(1+\alpha_a T) \quad (16)$$

If the laser is to operate on a single longitudinal mode over a temperature range, then $$2(m_d+m_x+m_y+m_z)=k \quad (17)$$

that is, the total number of half wavelengths between the ends of the optical cavity should be an integer constant.

Assuming that $L_x$ (the length of the LiNbO$_3$ between the diode and the beginning of the active mode converter electrodes) is the free variable, the solutions to the above system of equations are $$L_x = \frac{1}{n_{TM}-n_{TE}}\left(\frac{k}{2}\lambda - L_d(1+\alpha_d T)n_d(1+Dn_d T) - L(1+\alpha_a T)n_{TE}\right) \quad (18)$$

$$L_y = \frac{m\lambda}{n_{TM}-n_{TE}} \quad (19)$$

$$L_z=L(1+\alpha_a T)-L_x-L_y \quad (20)$$

Combining the above equations with the Sellmeier equation, the desired lengths of the various LiNbO$_3$ sections can be written $$[L_x,L_y,L_z]=f(L_d,L,m,\lambda,T,k) \quad (21)$$

That is, the LiNbO$_3$ section lengths are only a function of the diode length, the total LiNbO$_3$ length, number of birefringence cycles selected for the mode converter section, the wavelength of light, the temperature, and the number of half wavelengths in the laser cavity.

Given a physical device and an operational wavelength, the designer needs only to choose constants m and k, then $$[L_x, L_y, L_z] = g(T) \tag{22}$$

That is, the length of the various sections of $LiNbO_3$ can be scheduled as a function of temperature, thereby ensuring single mode operation (to within the model tolerance).

Thus, the designer may select m such that $L_y < L(1+\alpha_a T)$ that is the mode converter section should be shorter than the total $LiNbO_3$ length. If k is too large or too small, then the lengths $L_x$ and $L_z$ may be negative. The designer should therefore, choose m and k such that $L_x$ and $L_z$ remains positive over the operational temperature range.

For example, since $n_{TE}$ and $n_{TM}$ are monotonic and increasing with temperature over the standard telecommunications temperature range −5° C. to 85° C., the designer can simply choose a value of m such that $$L_y < L(1+\alpha_a T) \tag{23}$$

Then choose a value of k such that $L_x$ is zero at T=85° C., that is $$k = \text{round}(2/\lambda(L_d(1+\alpha_d T)n_d(1+Dn_d T) + L(1+\alpha_a T)n_{TE})) \tag{24}$$

If with this selection of k, $L_z$ is positive at T=−5° C., then m is sufficiently small.

The desired drive voltage in the mode converter section increases with decreasing m, so the designer will most likely be interested in maximizing m at design time, subject to the constraint of physically realizable $L_x$ and $L_z$.

Figure 2:
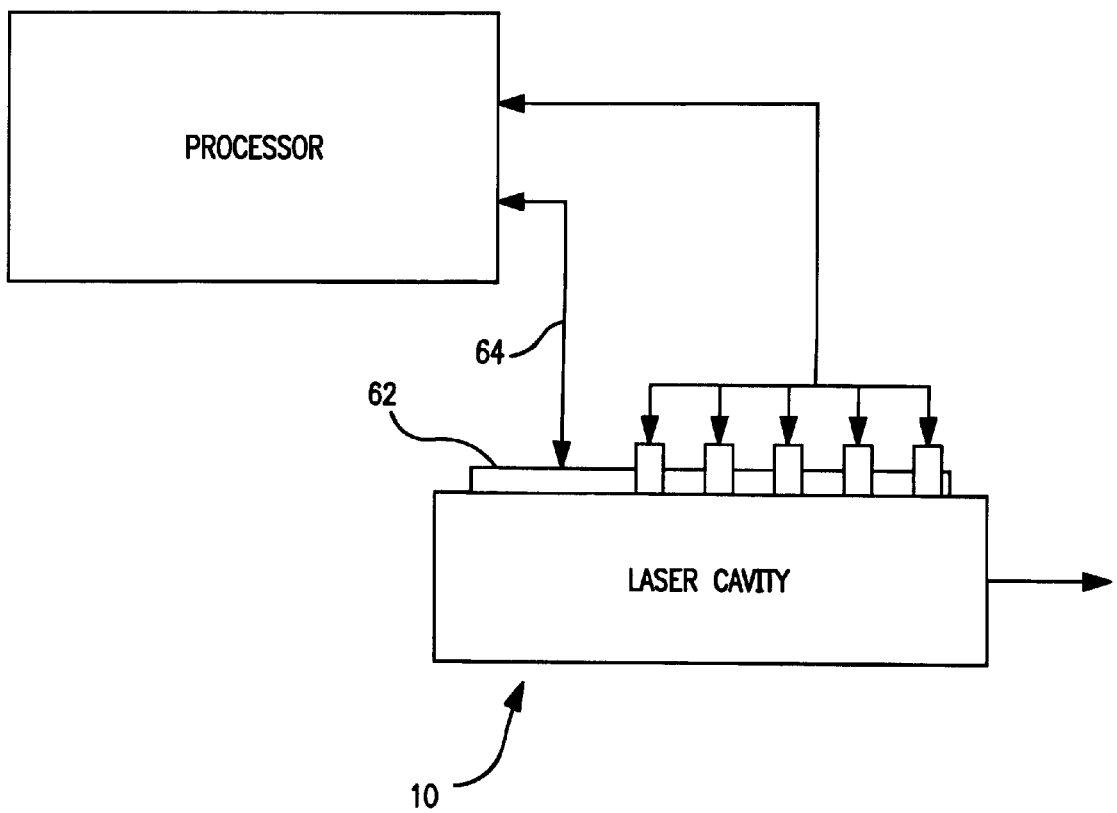
FIG. 2 is a simplified schematic of a preferred embodiment of the present invention.

Referring to FIG. 2, where like numerals represent like items, a computer controlled embodiment in accordance with the present invention is shown. In this embodiment, the transmitter 10 includes a temperature sensor 62 disposed on the transmitter 10. The temperature sensor 62 may be a thermistor, a thermocouple, or any of the widely available contact or non-contact temperature sensing devices. The temperature sensor 62 relays a signal to the processor 60 corresponding to the temperature of the transmitter 10. The processor 60 may comprise a general purpose computer, an application specific integrated circuit, one or more digital signal processors, etc. Based on the temperature signal, the processor 60 selectively energizes each electrode 53 separately to produce an output wave that is the desired frequency for the particular application.

More preferably, the processor 60 may selectively energize a predetermined first set of electrodes 72 (FIG. 1) at one end of the electro-optic chip 50. The location of this first set of electrodes 72 along the electro-optic chip 50 may then be altered (as shown by arrow A) by selectively energizing/de-energizing electrodes 53 to effectively move the location of the first set of electrodes 72. In this way, the laser cavity length may be altered to produce the require signal output. It is also possible for the processor to energize a second set of electrodes 70 at a predetermined distance from the first set of electrodes, thereby altering the effective optical cavity length of the laser. The processor may also alter the location of the second set of electrodes 70 by selectively energizing/de-energizing electrodes 53 to effectively move the location of the first set of electrodes 70 (as shown by arrow A). The movement of the first set of electrodes 72 and/or the second set of electrodes 70 may be performed individually or in unison as required to produce the desired output signal.

Figure 3:
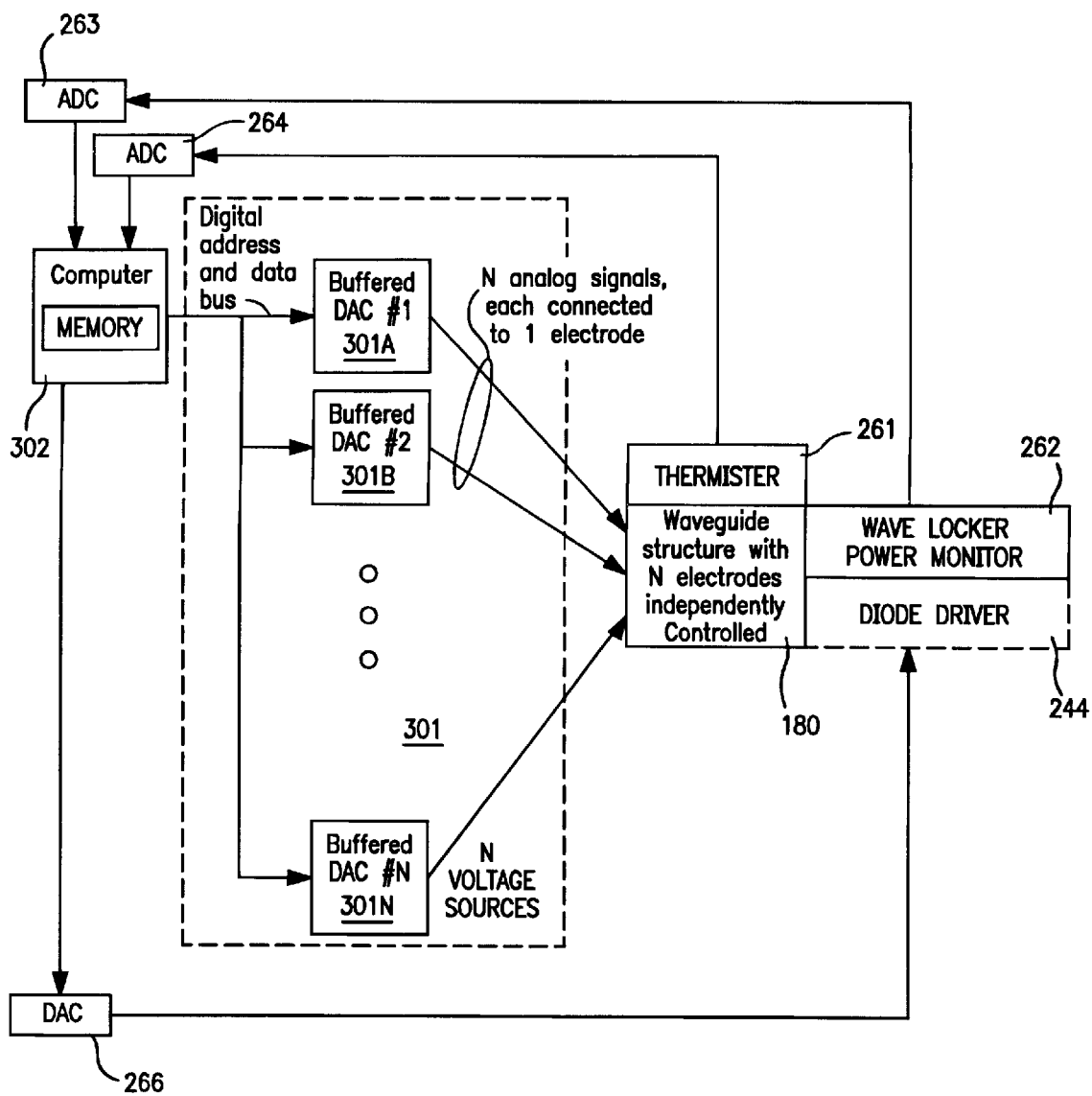
FIG. 3 is a simplified block diagram of a preferred embodiment of the present invention.

The method by which the laser output is measured and used by the processor to drive the electrodes will now be described. Referring to FIG. 3, a computer 302 of a preferred embodiment of the present invention is coupled to diode driver 244 via a DAC 266 to control the supply of current to gain chip 42 (FIG. 1), and is further coupled to receive signals from a wave locker and power monitor 262 via an analog to digital converter (ADC) 263. Wave locker and power monitor 262 may include, for example, two diodes. In one implementation, the two diodes generate sum and difference signals of the energy incident thereon and these two signals are transmitted on a two-wire bus to the ADC 263. In an alternative implementation, one, diode is used for measuring the wavelength of the laser beam being generated, and another diode is used for measuring the power being generated. Therefore, computer 302 controls the wavelength and power of the laser beam generated by waveguide chip 180 via a feedback loop.

Computer 302 is further coupled to receive a temperature signal from a thermistor 261 via an analog to digital converter (ADC) 264. Thermistor 261 is physically attached to waveguide chip 180 to provide a measure of the temperature of the waveguide chip 180.

Figure 4:
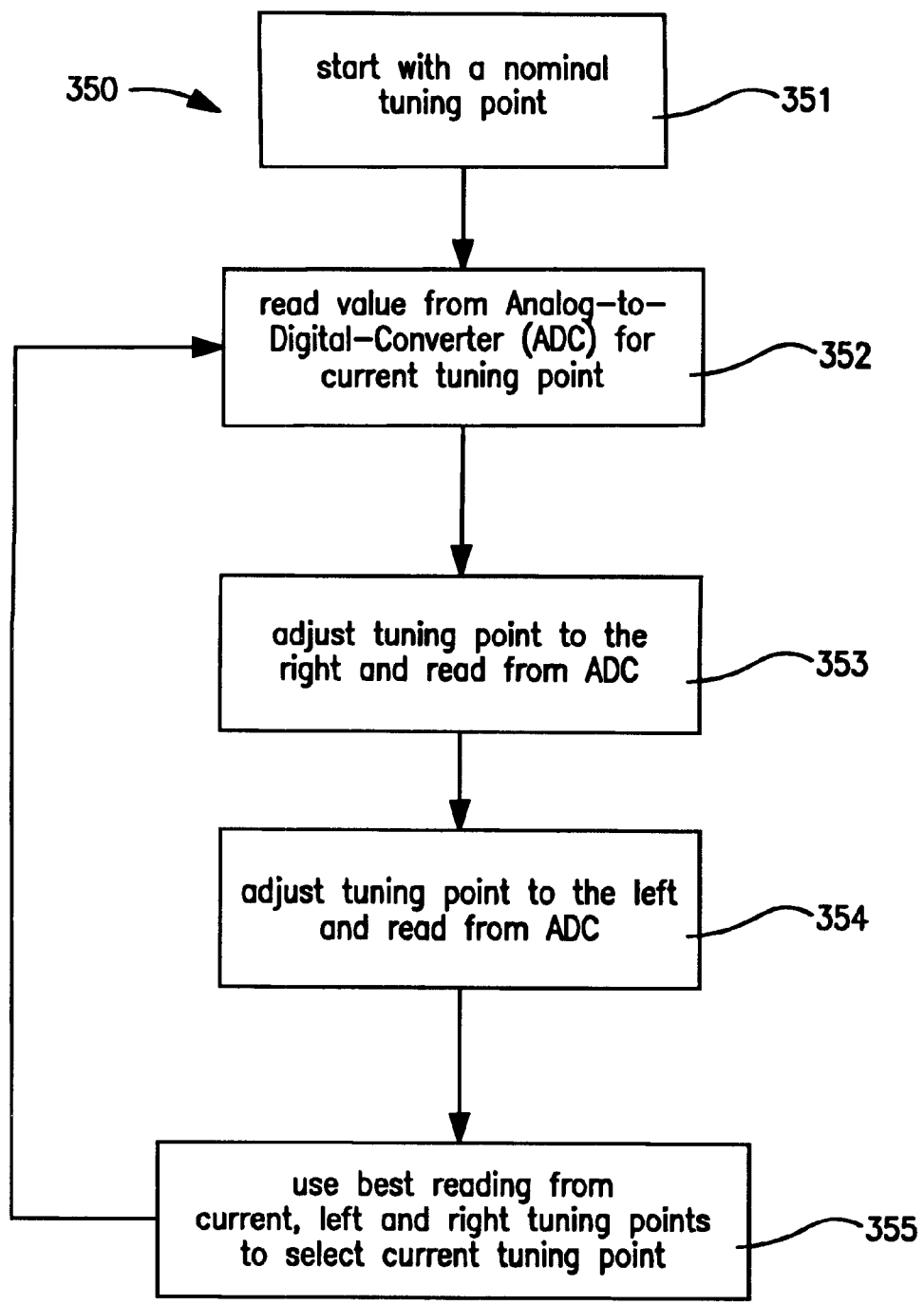
FIG. 4 is a flow diagram of software for use in the computer of FIG. 3.

The digital signal that is transmitted to buffered DACs 301A–301N are set by a computer program that performs the method 350 of FIG. 4. Specifically, in one embodiment, computer 302 hunts for the best set of voltage levels to be applied from among a group of sets that are predetermined and stored in memory. For example, a single set of voltage levels VA–VN (also called "tuning point") may be effective at a specific temperature to produce a laser of a specific wavelength. If the temperature changes, a different set of voltage levels is needed. For this reason, computer 302 starts with a set SC (see act 351 in FIG. 4) that is known (from experiment) to produce a laser of the specified wavelength λs. Thereafter, computer 302 repeatedly performs acts 352–355 in a loop as follows.

In act 352, computer 302 reads values of the wavelength and power from ADC 263 (described above). Thereafter, in act 353, computer 302 replaces the set SC of voltage levels that are currently applied with another set SN that is known to produce a laser of the next larger wavelength λn (depending upon the resolution, such a wavelength may be just 0.01 nm larger than the current wavelength). Then computer 302 again reads from ADC 263 the values of wavelength and power generated by use of set λN.

Then in act 354, computer 302 replaces set SN with another set SP that is known to produce a laser of a next smaller wavelength λp, and again reads from ADC 263. Next, in act 354 computer 302 determines which of the respective sets produced the best readings (e.g. which produced the most power at the specified wavelength λs), and then selects this set as the current set for the next iteration of the loop (and returns to act 352, e.g. after waiting for a predetermined duration). In this manner, over time, a single set SC is used (for successive periods of the predetermined duration), as long as the operating conditions remain unchanged.

Although the preferred embodiment uses a diode with greater gain for the TE mode, coupling to the TM mode in the electro-optic waveguide and a TE pass polarizer, several other combinations are possible: the diode may have greater gain in the TM mode, it may couple to the TM mode in the electro-optic waveguide, and the polarizer may be TE pass; the diode may have greater gain in the TE mode, it may couple to the TE mode in the electro-optic waveguide, and the polarizer may be TM pass; the diode may have greater gain in the TM mode, it may couple to the TM mode in the electro-optic waveguide, and the polarizer may be TE pass;

or the diode (with greater gain in the TE or the TM mode) may couple into both the TM and TE modes of the waveguide, and the polarizer may be either TM pass or TE pass.

The above described embodiment is applicable to any mode coupling process, where the coupling is between two or more modes that have different effective indices. According to this embodiment, the control of the location of the coupling (through control of the location of the active mode converter electrodes) enables the control of the optical length through which the light travels. Examples of alternative embodiments include co-directional mode coupling between two or more guides of substantially different effective indicies, contradirectional coupling in a waveguide (also known as Bragg reflection), coupling between core modes and cladding modes, and the like.

The case of codirectional coupling among two or more guides is similar to the polarization mode conversion embodiment cited above. The control of the location of the coupling allows the control of the distance that the light travels in one of the guides compared to the distance that the light travels in the other guides. Since the effective indices of the guides are substantially different, the modification of the location of the mode coupling modifies the optical length of the device.

In the case of contradirectional coupling, the location of the mode converter alters the distance that the light travels upon entering the device before encountering the mode conversion, and the distance that the light travels after "reflection" in order to exit the device. Another way of considering this case is to consider contradirectional coupling as simply mode coupling between a mode with effective index $n_{eff}$, and a mode with effective index $-n_{eff}$, thus $n=(n_{eff}-(-n_{eff}))=2n_{eff}$, where $n_{eff}$ is the effective index of propagation in the guide. In either interpretation, controlling the location of the mode converter directly controls the optical length of the device.

The case of coupling between core and cladding modes is similar to the case of coupling between TE and TM modes in a birefringent material. The frequency selective coupling occurs between modes of different propagation constants, thus the location of the active mode converter electrodes allows variation in the total optical length that the light must travel when transiting the device.

This invention is useful in a telecommunications network in that it allows the generation of light at precisely controlled wavelengths (frequencies), without the need for extra external control actuators (mechanical, temperature and the like) in order to maintain tightly controlled wavelengths. In a typical network, the laser invention disclosed herein would generate a signal at a precisely controlled wavelength, or would generate light at a constant wavelength, which would then be passed through a modulator which would impart the data signal on the light. The light would enter the optical network through a fiber, transmitting its signal to a receiver within or on the edge of the network.

It is to be understood that the invention is not limited to the illustrations described herein, which are deemed to illustrate the best modes of carrying out the invention, and which are susceptible to modification of form, size, arrangement of parts and details of operation. The invention is intended to encompass all such modifications, which are within its spirit and scope as defined by the claims.

What is claimed is:

1. Apparatus for controlling the length of a laser cavity, comprising:
   a laser diode configured to produce a beam of energy, said laser diode having a first end and an output end, said first end being in optical communication with a highly reflective mirror;
   a wave guide having a receiving end and a transmission end, said wave guide being comprised of an electro-optical material, said receiving end being in optical communication with said laser diode output end to receive the beam of energy, and said transmission end being configured to be in optical communication with an output coupler;
   a plurality of electrodes disposed along a longitudinal axis of said wave guide;
   circuitry which independently controls voltages on a sub-plurality of said plurality of electrodes to alter an index of refraction of said wave guide to alter the length of the laser cavity; and,
   a polarizer disposed adjacent said transmission end, said polarizer configured to attenuate the beam of energy transmitted by the wave guide transmission end.

2. The apparatus of claim 1, further comprising an electrical current source coupled to said laser diode.

3. The apparatus of claim 2, wherein said circuitry controls voltages on a different sub-plurality of electrodes to further alter the index of refraction of said waveguide to further alter the length of the laser cavity.

4. The apparatus of claim 3, wherein said circuitry controls voltages of said different sub-plurality of electrodes and said sub-plurality of electrodes to substantially move an index of refraction profile of said laser cavity.

5. The apparatus of claim 1, wherein said laser diode further comprises an anti-reflective coating.

6. The apparatus of claim 1, wherein said laser diode is butt coupled to said wave guide.

7. The apparatus of claim 1, wherein said laser diode is coupled to said wave guide by coupling optics.

8. The apparatus of claim 7, wherein said coupling optics comprises a silica lens.

9. The apparatus of claim 1, wherein said circuitry selectively energizes said sub-plurality of electrodes to define an optical path in said wave guide, said optical path having a length that defines a free spectral range of the laser cavity that is a rational fraction of a specified communication frequency channel spacing within an optical frequency band corresponding to said laser diode.

10. The apparatus of claim 1, wherein said circuitry selectively energizes said sub-plurality of electrodes to define an optical path in said wave guide, said optical path having a length that defines a free spectral range of the laser cavity that is a rational fraction of a desired lasing wavelength within an optical frequency band corresponding to said laser diode.

11. The apparatus of claim 1, wherein said circuitry selectively energizes said sub-plurality of electrodes based on a temperature profile along the laser cavity.

12. The apparatus of claim 11, further comprising a temperature sensor coupled to said circuitry and configured to sense the temperature profile along the laser cavity.

13. The apparatus of claim 1, wherein said electro-optical material comprises a refractive index that changes with changes in voltage applied to each said electrode.

14. The apparatus of claim 1, wherein said electro-optical material comprises $LiNbO_3$.

15. The apparatus of claim 1, wherein said wave guide comprises an electro-optical material that is x-cut, y-propagating lithium niobate.

16. The apparatus of claim 1, wherein said wave guide comprises an electro-optical material that is y-cut, x-propagating lithium niobate.

17. The apparatus of claim 1, wherein said wave guide comprises an electro-optical material that is z-cut, x-propagating lithium niobate.

18. The apparatus of claim 1, wherein said wave guide comprises an electro-optical material that is z-cut, y-propagating lithium niobate.

19. The apparatus of claim 1, wherein said laser diode further comprises a diode wave guide that is birefringent.

20. The apparatus of claim 19, wherein said diode wave guide has an optical gain in the transverse electric mode which is larger than an optical gain in the transverse magnetic mode.

21. The apparatus of claim 19, wherein said diode wave guide has an optical gain in the transverse magnetic mode which is larger than an optical gain in the transverse electric mode.

22. The apparatus of claim 1, wherein the orientation of the laser diode to the wave guide is such that the energy coupled from the diode to the wave guide excites the transverse magnetic mode in the wave guide.

23. The apparatus of claim 1, wherein the orientation of the laser diode to the wave guide is such that the energy coupled from the diode to the wave guide excites the transverse electric mode in the wave guide.

24. The apparatus of claim 1, wherein the orientation of the laser diode to the wave guide is such that the energy coupled from the diode to the wave guide excites the transverse electric mod and transverse magnetic mode in the wave guide.

25. The apparatus of claim 1, wherein said polarizer attenuates at least one of transverse magnetic energy and transverse electric energy in said wave guide.

26. The apparatus of claim 1, wherein said wave guide comprises an anti-reflective coating.

27. A wave guide for controlling the output of an energy beam source, comprising;
   a body comprised of electro-optical material, said body having an input end for receiving an energy beam from the energy beam source, an output end for emitting an output energy beam, and a longitudinal axis;
   a plurality of electromagnetic fields coupled to said body;
   circuitry which alters an index of refraction along said longitudinal axis by altering a sub-plurality of said plurality of electromagnetic fields to change a cavity length of said body; and,
   a polarizer disposed with respect to said body output end to filter unwanted portions of a signal associated with said energy beam source.

28. The wave guide of claim 27, wherein the energy beam source comprises a laser diode.

29. The wave guide of claim 27, wherein said circuitry controls voltages on a different sub-plurality of electromagnetic fields to further alter the index of refraction of said body to further alter the length of the wave guide.

30. The wave guide of claim 29, wherein said circuitry controls voltages of said different sub-plurality of electromagnetic fields and said sub-plurality of electromagnetic fields to substantially move an index of refraction profile of said wave guide.

31. The wave guide of claim 27, wherein said energy beam source comprises a semiconductor laser medium.

32. The wave guide of claim 27, wherein said energy beam source further comprises an anti-reflective coating.

33. The wave guide of claim 27, wherein said energy beam source is butt coupled to said body.

34. The wave guide of claim 27, wherein said energy beam source is coupled to said body by coupling optics.

35. The wave guide of claim 34, wherein said coupling optics comprise a silica lens.

36. The wave guide of claim 27, wherein selectable application of each said electromagnetic field defines an optical path in said body, wherein said optical path has a length that defines a free spectral range of the wave guide that is a rational fraction of a specified communication frequency channel spacing within an optical frequency band corresponding to the energy source.

37. The wave guide of claim 27, wherein selectable application of each said electromagnetic field defines an optical path in said body, wherein said optical path has a length that defines a free spectral range of the body that is a rational fraction of a desired lasing wavelength within an optical frequency band corresponding to the energy source.

38. The wave guide of claim 27, wherein said circuitry selectively energizes each said electrode based on a temperature profile along said body.

39. The wave guide of claim 38, further comprising a temperature sensor configured to sense the temperature profile along said body.

40. The wave guide of claim 27, wherein said electro-optical material comprises a refractive index that changes with changes in the applied electromagnetic field.

41. The wave guide of claim 27, wherein said electro-optical material comprises $LiNbO_3$.

42. The wave guide of claim 27, wherein said body comprises an electro-optical material that is x-cut, y-propagating lithium niobate.

43. The wave guide of claim 27, wherein said body comprises an electro-optical material that is y-cut, x-propagating lithium niobate.

44. The wave guide of claim 27, wherein said body comprises an electro-optical material that is z-cut, x-propagating lithium niobate.

45. The wave guide of claim 27, wherein said body comprises an electro-optical material that is z-cut, y-propagating lithium niobate.

46. The wave guide of claim 27, wherein said energy beam source further comprises a diode wave guide that is birefringent.

47. The wave guide of claim 46, wherein said diode wave guide has an optical gain in the transverse electric mode which is larger than an optical gain in the transverse magnetic mode.

48. The wave guide of claim 46, wherein said diode wave guide has an optical gain in the transverse magnetic mode which is larger than an optical gain in the transverse electric mode.

49. The wave guide of claim 27, wherein the orientation of the energy beam source to the wave guide is such that energy coupled from the energy beam source to the wave guide excites the transverse magnetic mode in the wave guide.

50. The wave guide of claim 27, wherein the orientation of the energy beam source to the wave guide is such that energy coupled from the energy beam source to the wave guide excites the transverse electric mode in the wave guide.

51. The wave guide of claim 27, wherein the orientation of the energy beam source to the wave guide is such that energy coupled from the energy beam source to the wave guide excites both the transverse magnetic mode and the transverse electric mode in the wave guide.

52. The wave guide of claim 27, wherein said polarizer attenuates transverse magnetic energy in the wave guide.

53. The wave guide of claim 27, wherein said polarizer attenuates transverse electric energy in the wave guide.

54. A transmitter for use with a fiber optic telecommunications network, comprising:
- a semi-conductor optical gain device coupled to receive an input signal, said optical gain device producing a light signal corresponding to the input signal;
- a wave guide having an input end to receive the light signal from said optical gain device, said wave guide device comprising an electro-optical material;
- a plurality of electrodes in electromagnetic communication with said wave guide;
- circuitry which selectively drives a sub-set of said plurality of electrodes to alter an index of refraction of said wave guide to keep substantially constant a cavity length of said wave guide adjacent each electrode; and,
- structure for transmitting said beam to the telecommunications network.

55. The transmitter of claim 54, wherein said circuitry controls voltages on a different sub-plurality of electrodes to further alter the index of refraction of said wave guide to further alter the length of said cavity.

56. The transmitter of claim 55, wherein said circuitry controls voltages of said different sub-plurality of electrodes and said sub-set of said plurality of electrodes to substantially move an index of refraction profile of said wave guide.

57. The transmitter of claim 54, wherein said optical gain device is butt coupled to said wave guide.

58. The transmitter of claim 54, wherein selectable activation of each said electrode defines an optical path in said wave guide, wherein said optical path has a length that defines a free spectral range of the wave guide that is a rational fraction of a specified communication frequency channel spacing within an optical frequency band corresponding to said optical gain device.

59. The transmitter of claim 54, wherein selectable activation of each said electrode defines an optical path in said wave guide, wherein said optical path has a length that defines a free spectral range of the wave guide that is a rational fraction of a desired lasing wavelength within an optical frequency band corresponding to said optical gain device.

60. The transmitter of claim 54, wherein each said electrode is selectively energized based on a temperature profile along said wave guide.

61. The transmitter of claim 60, further comprising a temperature sensor configured to sense the temperature profile along said wave guide.

62. The transmitter of claim 54, wherein said electro-optical material comprises a refractive index that changes with changes in the voltage applied to each said electrode.

63. The transmitter of claim 54, wherein said electro-optical material comprises $LiNbO_3$.

64. The transmitter of claim 54, wherein said electro-optic material comprises an electro-optical material that is x-cut, y-propagating lithium niobate.

65. The transmitter of claim 54, wherein said electro-optic material comprises an electro-optical material that is y-cut, x-propagating lithium niobate.

66. The transmitter of claim 54, wherein said electro-optic material comprises an electro-optical material that is z-cut, x-propagating lithium niobate.

67. The transmitter of claim 54, wherein said electro-optic material comprises an electro-optical material that is z-cut, y-propagating lithium niobate.

68. The transmitter of claim 54, wherein said optical gain device further comprises a second wave guide that is birefringent.

69. The transmitter of claim 68, wherein said second wave guide is characterized by the optical gain in the transverse electric mode being larger than the optical gain in the transverse magnetic mode.

70. The transmitter of claim 54, wherein the orientation of the optical gain device to the wave guide is such that light coupled from the optical gain device to the wave guide excites the transverse magnetic mode in said wave guide.

71. The transmitter of claim 54, further comprising a filter configured to attenuate transverse magnetic energy in said wave guide.

72. The transmitter of claim 54, further comprising a filter configured to attenuate transverse electric energy in said wave guide.

73. The transmitter of claim 54, further comprising a filter configured to attenuate transverse magnetic energy and transverse electric energy in said wave guide.

74. An electro-optically tuned laser source with an athermal resonator comprising:
- a laser gain medium;
- an intracavity waveguide segment comprised of electro-optical material optically coupled to said laser gain medium; and,
- feedback circuitry for defining a resonant laser cavity including said gain medium and said intracavity waveguide segment, said feedback circuitry including, (i) a plurality of electrodes disposed along said intracavity waveguide segment, and (ii) drive circuitry which selectively energizes more than one of said plurality electrodes to tune a frequency of operation of a laser cavity of said resonator.

75. The laser source of claim 74, wherein said circuitry controls voltages on a different sub-plurality of electrodes to further alter the index of refraction of said intracavity waveguide segment to further alter the length of the laser cavity.

76. The laser source of claim 74, wherein said circuitry controls voltages of said different sub-plurality of electrodes and said more than one of said plurality of electrodes to substantially move an index of refraction profile of said intracavity waveguide segment.

77. The laser source of claim 74, wherein said laser gain medium is butt coupled to said intracavity waveguide segment.

78. The laser source of claim 74, wherein said laser gain medium is coupled to said intracavity waveguide by coupling optics.

79. The laser source of claim 78, wherein said coupling optics comprises a silica lens.

80. The laser source of claim 74, wherein selectable activation of each said electrode defines an optical path in said intracavity waveguide segment, wherein said optical path has a length that defines a free spectral range of the intracavity waveguide segment that is a rational fraction of a desired lasing wavelength within an optical frequency band corresponding to said laser gain medium.

81. The laser source of claim 74, wherein selectable activation of each said electrode defines an optical path in said intracavity waveguide segment, wherein said optical path has a length that defines a free spectral range of the intracavity waveguide segment that is a rational fraction of a specified communication frequency channel spacing within an optical frequency band corresponding to said laser gain medium.

82. The laser source of claim 74, wherein each said electrode is s energized based on a temperature profile along said intracavity waveguide segment.

83. The laser source of claim 82, further comprising a temperature sensor configured to sense a temperature profile along said intracavity waveguide segment.

84. The laser source of claim 74, wherein said electro-optical material comprises a refractive index change with changes a voltage applied to each said electrode.

85. The laser source of claim 74, wherein said electro-optical material comprises $LiNbO_3$.

86. The laser source of claim 74, wherein said intracavity waveguide segment comprises an electro-optical material that is x-cut, y-propagating lithium niobate.

87. The laser source of claim 74, wherein said intracavity waveguide segment comprises an electro-optical material that is y-cut, x-propagating lithium niobate.

88. The laser source of claim 74, wherein said intracavity waveguide segment comprises an electro-optical material that is z-cut, x-propagating lithium niobate.

89. The laser source of claim 74, wherein said intracavity waveguide segment comprises an electro-optical material that is z-cut, y-propagating lithium niobate.

90. The laser source of claim 74, wherein said laser gain medium further comprises a second wave guide that is birefringent.

91. The laser source of claim 74, wherein said second wave guide is characterized by the optical gain in the transverse electric mode being larger than the optical gain in the transverse magnetic mode.

92. The laser source of claim 74, wherein the orientation of the laser gain medium to said intracavity waveguide segment is such that energy coupled from the laser gain medium to said intracavity waveguide segment excites the transverse magnetic mode in said intracavity waveguide segment.

93. The laser source of claim 74, wherein the orientation of the laser gain medium to said intracavity waveguide segment is such that energy coupled from the laser gain medium to said intracavity waveguide segment excites the transverse electric mode in said intracavity waveguide segment.

94. The laser source of claim 74, wherein the orientation of the laser gain medium to said intracavity waveguide segment is such that energy coupled from the laser gain medium to said intracavity waveguide segment excites the transverse magnetic and transverse electric mode in said intracavity waveguide segment.

95. A method for controlling the output frequency of a laser, comprising the steps of:
providing a laser gain medium;
placing an intracavity waveguide segment comprised of electro-optical material in optical communication with, said laser gain medium;
providing a feedback means for defining a resonant laser cavity, said resonant laser cavity including said gain medium and said intracavity waveguide segment, said feedback means comprising a plurality of electrodes disposed along said intracavity waveguide segment; and,
selectably energizing a sub-plurality of said plurality of electrodes to tune a frequency of operation of said laser.

96. Computer readable storage media storing code which causes a host processor to control the output frequency of a laser assembly, the laser assembly comprising a laser gain medium optically coupled to a waveguide segment, the waveguide segment comprised of electro-optical material and a plurality of electrodes adjacent a surface of the waveguide segment, the code causing the host processor to:
receive a required operating frequency of the laser assembly;
measure an actual operating frequency of the laser assembly;
receive data from a sensor, said sensor configured to measure the temperature of the laser assembly;
selectably energizing a sub-set of the electrodes based on said data from said sensor, such that the actual operating frequency is substantially equal to the required operating frequency.

97. A method for controlling the optical length of a laser cavity comprising the steps of:
providing a laser gain medium;
placing an intracavity waveguide segment comprised of electro-optical material in optical communication with said laser gain medium;
providing a plurality of electrodes disposed along a longitudinal axis of said intracavity wave guide segment; and,
selectively energizing a predetermined first set of said electrodes to control the optical length of said laser cavity.

98. The method of claim 97, further comprising the step of selectively energizing a predetermined second set of said electrodes to control the optical length of said laser cavity.

99. The method according to claim 97 further comprising the step of selectively changing the location of the first set of electrodes along said longitudinal axis.

100. The method according to claim 97 further comprising the step of selectively changing the location of the second set of electrodes along said longitudinal axis.

101. The method according to claim 97, wherein said laser gain medium comprises a laser diode.

102. The method according to claim 97, wherein said intracavity wave guide segment comprises $LiNbO_3$.

103. The method according to claim 97, wherein said intracavity waveguide segment comprises an electro-optical material that is x-cut, y-propagating lithium niobate.

104. The method according to claim 97, wherein said intracavity waveguide segment comprises an electro-optical material that is y-cut, x-propagating lithium niobate.

105. The method according to claim 97, wherein said intracavity waveguide segment comprises an electro-optical material that is z-cut, x-propagating lithium niobate.

106. The method according to claim 97, wherein said intracavity waveguide segment comprises an electro-optical material that is z-cut, y-propagating lithium niobate.

107. The method according to claim 97, wherein said laser gain medium further comprises a second wave guide that is birefringent.

108. The method according to claim 97, wherein said second wave guide is characterized by the optical gain in the transverse electric mode being larger than the optical gain in the transverse magnetic mode.

109. The method according to claim 97, wherein the orientation of the laser gain medium to said intracavity waveguide segment is such that energy coupled from the laser gain medium to said intracavity waveguide segment excites the transverse magnetic mode in said intracavity waveguide segment.

110. The method according to claim 97, wherein the orientation of the laser gain medium to said intracavity waveguide segment is such that energy coupled from the laser gain medium to said intracavity waveguide segment excites the transverse electric mode in said intracavity waveguide segment.

111. The method according to claim 97, wherein the orientation of the laser gain medium to said intracavity waveguide segment is such that energy coupled from the laser gain medium to said intracavity waveguide segment excites the transverse magnetic and transverse electric mode in said intracavity waveguide segment.

* * * * *